United States Patent
Tsironis (10) Patent No.: US 11,137,470 B1
(45) Date of Patent: Oct. 5, 2021

(54) COAXIAL TRL CALIBARTION KIT ADAPTER

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 16/743,822

(22) Filed: Jan. 15, 2020

(51) Int. Cl.
*G01R 35/00* (2006.01)
*G01R 27/32* (2006.01)

(52) U.S. Cl.
CPC .......... *G01R 35/005* (2013.01); *G01R 27/32* (2013.01)

(58) Field of Classification Search
CPC .............................. G01R 35/005; G01R 27/32
USPC .......................................................... 324/629
See application file for complete search history.

(56) References Cited

U.S. PATENT DOCUMENTS

| 9,553,376 B1* | 1/2017 | Tsironis | ............... | H01R 9/0524 |
| 2003/0132759 A1* | 7/2003 | Tsironis | ............. | G01R 1/06772 |
| | | | | 324/601 |

OTHER PUBLICATIONS

Scattering parameter [online], Wikipedia, [retrieved on Oct. 16, 2019]. Retrieved from Internet <URL: https://en.wikipedia.org/wiki/Scattering_parameters>.
"Network Analyzer Basics", Agilent Technologies, pager 49ff.
"Network Analyzer Error Models and Calibration Methods", Agilent Technologies, pp. 27-32.
Two-Port network [online], Wikipedia, [Retrieved Oct. 16, 2019]. Retrieved from Internet <URL: https://en.wikipedia.org/wiki/Two-port_network>.
"Calibration Techniques of Network Analyzers for Tuner Characterization," Application Note 13, Focus Microwaves, May 1994, p. 4.

* cited by examiner

*Primary Examiner* — Farhana A Hoque (57) ABSTRACT

A TRL calibration kit including THRU, REFLECT and a set of DELAY line standards and associated thread extension and holding device, allowing for employing more than one DELAY line standard without modifying the configuration, for higher wideband calibration accuracy. The thread extension allows inserting and securing multiple DELAY lines without removing the device by just inserting and releasing set screws in-situ. This provides for best repeatability of the connections.

4 Claims, 9 Drawing Sheets

COAXIAL TRL CALIBARTION KIT ADAPTER

PRIORITY CLAIM

Not applicable.

CROSS-REFERENCE TO RELATED ARTICLES

1. Scattering parameter [online], Wikipedia, [retrieved on 2019-10-16]. Retrieved from Internet <URL: https://en.wikipedia.org/wiki/Scattering_parameters>.
2. "Network Analyzer Basics", Agilent Technologies, pager 49ff.
3. "Network Analyzer Error Models and Calibration Methods", Agilent Technologies, pages 27-32.
4. Two-Port network [online], Wikipedia, [Retrieved 2019-10-16]. Retrieved from Internet <URL: https://en.wikipedia.org/wiki/Two-port_network>.
5. "Calibration Techniques of Network Analyzers for Tuner Characterization," Application Note 13, Focus Microwaves, May 1994, page 4.

BACKGROUND OF THE INVENTION

Figure 1:
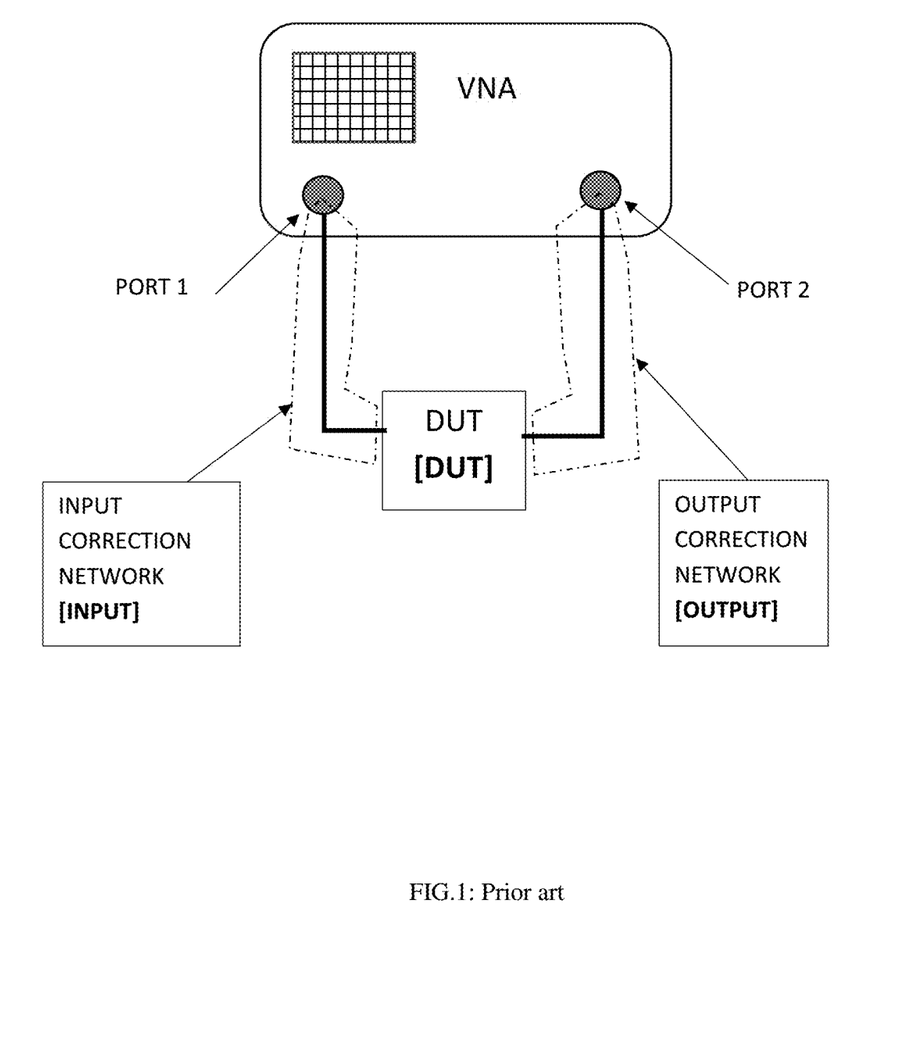
FIG. 1 depicts prior art, a typical TRL calibration setup of a vector network analyzer (VNA).

This invention relates to scattering (s-) parameter (see ref. 1) measurements of microwave components (device under test, DUT) using vector network analyzers (VNA, see ref. 2). VNA are tuned receivers able to measure amplitude and phase of signals injected into and extracted from the DUT (FIG. 1). To be able to extract the s-parameters of the DUT itself, the VNA must be calibrated, i.e. the transformation networks described as "error term matrices" between the DUT reference plane and the internal detectors of the VNA must be determined; this determination process is called VNA calibration; this error term data is then saved in VNA calibration files internally inside the VNA memory and is used to convert the raw [RAW] measurements at the VNA internal detectors to the final DUT [DUT] data. This process is called de-embedding, i.e. extracting the embedded DUT data from the raw data. Since the internal couplers, cables and adapters or test fixtures can be described as two-ports cascaded with the DUT once the s-parameters of those interfering two-ports are determined experimentally through proper calibration, the raw measured s-parameters are cascaded with their invers matrices to extract the corrected DUT s-parameters following the scheme:
 [DUT]=[INPUT]$^{-1}$*[RAW]*[OUTPUT]$^{-1}$. Herein [DUT], [INPUT], [RAW] and [OUTPUT] are ABCD matrices derived numerically from the associated s-parameters (see ref. 4).

A commonly used calibration method is the THRU-REFLECT-LINE (TRL) calibration. The LINE standard is also called DELAY line. The complete TRL calibration theory includes correction for spurious terms such as directivity of couplers and non-perfect cable matching (see ref. 3) though this being all prior art it is used as background and is not part of the invention.

BRIEF SUMMARY OF THE INVENTION

The invention discloses a simple device that allows a practical and handy insertion and securing of a single and multiple DELAY line set of TRL calibration standards. DELAY line standards are critical for TRL calibration method. When the method elected comprises more than one DELAY standard the varying dimensions require a flexible as well secure mechanism. The problem is that, when inserting the DELAY 50 (FIGS. 3A, 3B and 5A) into the cascade of male-female line, the original thread 51 of the male adapter does not reach far enough to be able to catch on and secure the female thread. The original thread 51 must therefore be efficiently extended; and, if more than one DELAY line is used this extension must also be adjustable to match the specific DELAY.

Such a device is disclosed below. In this specification this new device is called one of the following names: a) DELAY holder; b) Thread extender; c) Thread extension device (TED). Each of those names simply describes one or more functions of the device, it holds and secures the inserted DELAY line barrel and center pin by extending the male thread. It allows employing one or more (up to three) DELAY line standards, which in most cases is enough for a very wideband precise TRL calibration.

BRIEF DESCRIPTION OF THE SEVERAL VIEWS OF THE DRAWINGS

The invention and its mode of operation will be more clearly understood from the following detailed description when read with the appended drawings in which:

FIG. 2A through 2B depict partly prior art, coaxial connectors.

FIG. 3A through 3B depict prior art, short coaxial DELAY line standard.

FIG. 4A through 4B depict prior art, long DELAY line standard.

FIG. 5A through 5B depict the DELAY line holder (Thread extender) for a single short DELAY line standard.

FIG. 6A through 6B depict the DELAY line holder for a single long DELAY line standard.

FIG. 8A through 8B depict the holder of multiple DELAY line standards.

FIG. 9A through 9B depict DELAY line standard embedded into actual machine drawings of the set of adapters.

DETAILED DESCRIPTION OF THE INVENTION

Thru-Reflect-Line (TRL) calibration of network analyzers requires the measurement of three known standards, to be able to solve three complex equations. By standard procedure those three are: 1) a THRU line, 2) a DELAY line and 3) a REFLECT. There are some limitations as per the nature of the standards. The DELAY line cannot be longer than one quarter long at the middle frequency of the calibration Fc=(Fmax/2); this is because, if the transmission phase of the DELAY exceeds 360 degrees at the maximum frequency, then the TRL equations yield multiple possible solutions. However, whereas the length of the DELAY does not have to be known, the characteristic impedance Zd of the DELAY must be known, as determined by the ratio of the inner diameter of the DELAY barrel to the diameter of the center pin, and serves as the normalization impedance of the calibration. It is therefore convenient to choose Zd=Zo, the characteristic impedance of the cables and the VNA hardware, without this beiong a requirement. The REFLECT must be high. It does not have to be an OPEN or a SHORT, but it must reflect enough power back into the VNA ports to secure jitter-less reading by the detectors above the unavoidable electronic noise. However, the real difficulty is the creation of the same (amplitude and phase) REFLECT standard at both ports if we use a sexed system, i.e. a system with one male and one female adapter (all connector systems, except APC-7 are sexed, including BNC (1 GHz), SMA, N, 7/16, 3.5, 2.9, 2.4 1.8 (67 GHz) and 1.0 (110 GHz) mm see ref. 5).

For all above cable sizes, using more than a single DELAY line and splitting the calibration frequency range in smaller segments yields better accuracy. This is because during matrix manipulations the information provided by a single DELAY line creates singularity behavior of the inversed matrices at the lower or the higher frequency end. Therefore, the requirement of being able to handle more than one DELAY line standard using the same support components.

Figure 2A:
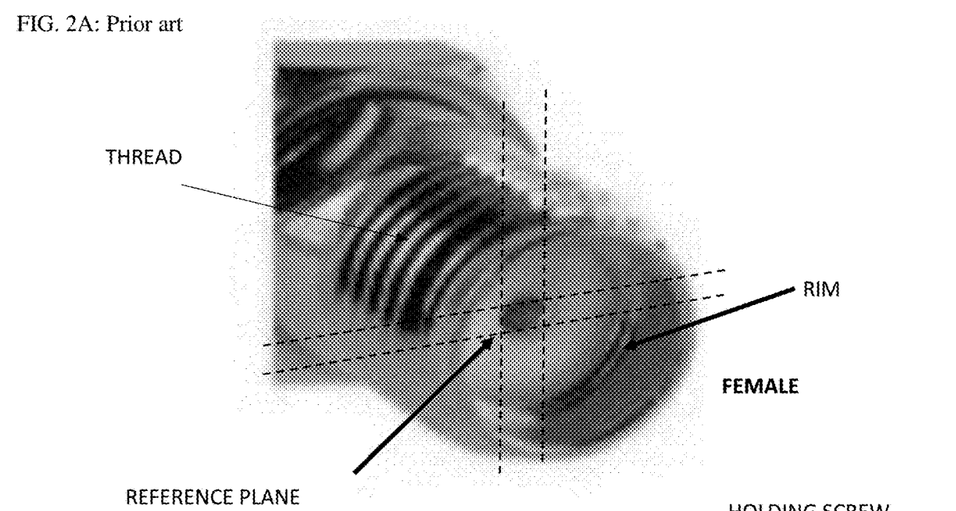
FIG. 2A depicts prior art female coaxial microwave connector.
Figure 2B:
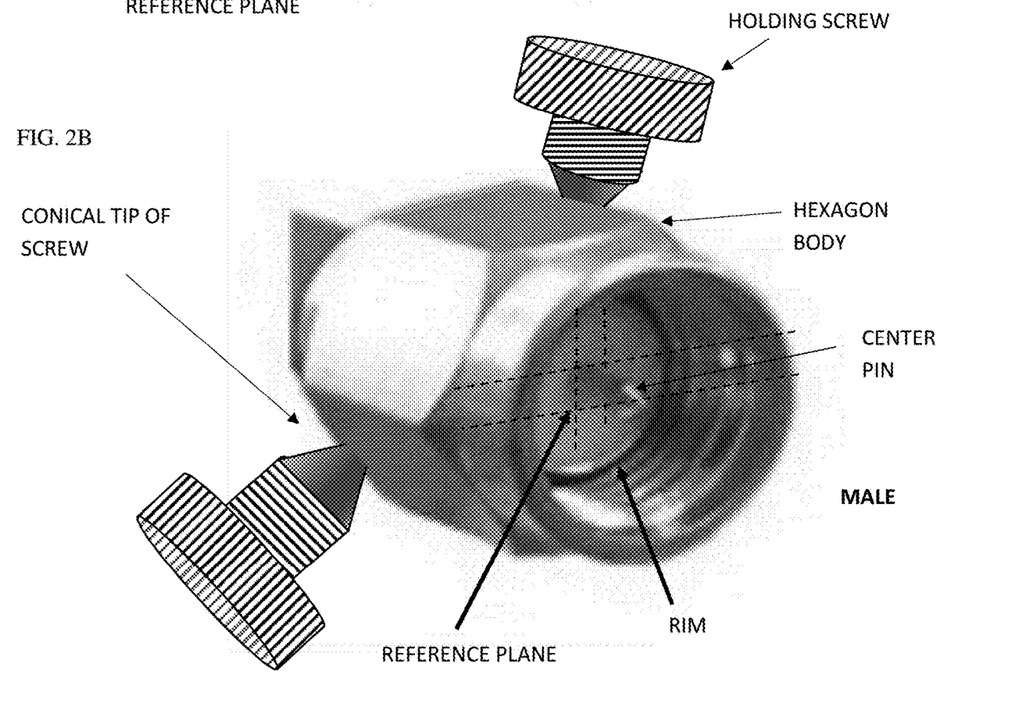
FIG. 2B depicts prior art male connector with newly introduced holding screws.

FIG. 2 depicts the typical male (FIG. 2B) and female (FIG. 2A) coaxial adapter defining the coaxial reference plane at which the VNA shall be calibrated. In the case of a THRU line standard those adapters are simply screwed tight one on each-other. The end of the female receptible defines the reference plane of the calibration. In the case of the male adapter the reference plane is defined as the step where the narrow section of the center pin begins. The hexagon body of the male adapter is screwed upon the female thread while the narrow segment of the pin of the male adapter is inserted and secured inside the hole of the female receptible. At the same time the rim of the ground cylinder of the male adapter makes perfect contact with the rim of the female adapter.

To be able to secure a grip of the male adapter over the thread of the female adapter, since the own thread does not reach that far after DELAY line barrels of different lengths (FIG. 3 and FIG. 4) are inserted between the male and female adapters, the thread of the male adapter must be lengthened or extended. This is possible using the DELAY line holder device shown in several embodiments in FIGS. 5 to 8.

Figure 5A:
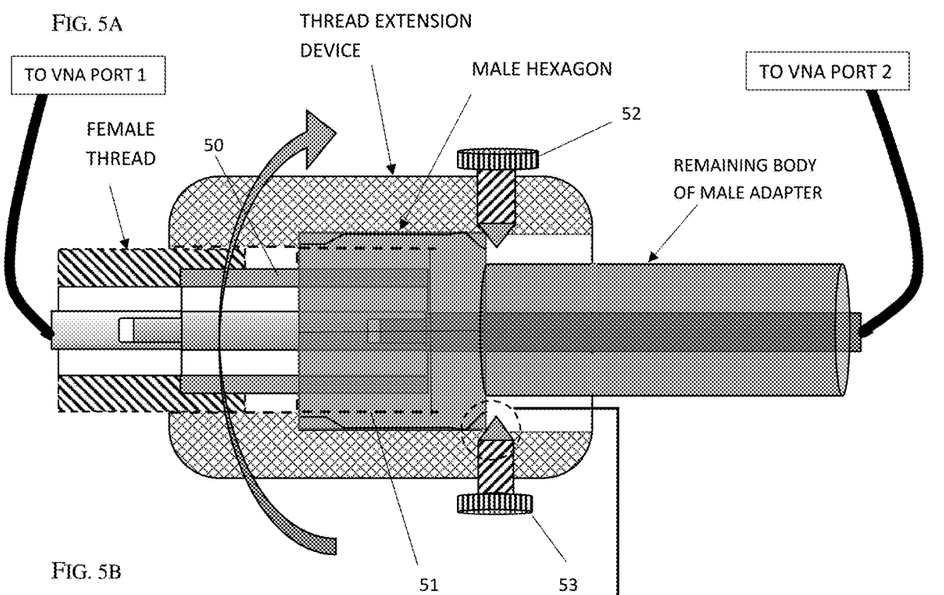
FIG. 5A depicts the holder with inserted DELAY line standard.
Figure 5B:
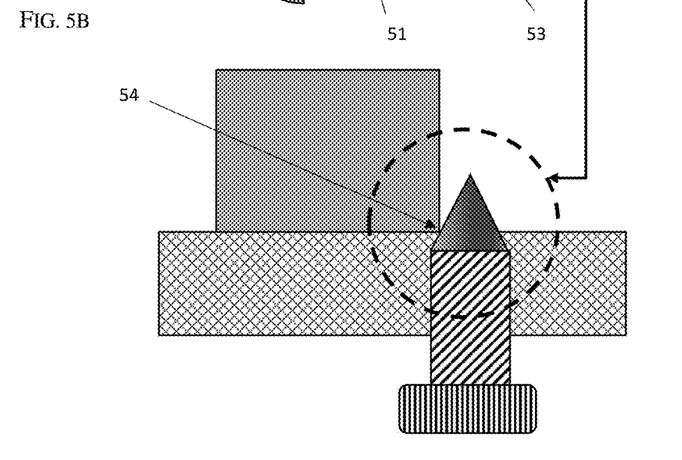
FIG. 5B depicts the anchoring detail of the holder on the male connector cap.

The basic embodiment is illustrated for the case of a single DELAY standard in FIG. 5A. The thread extender is a metallic cylinder divided in two segments. A first segment is threaded inside to match the thread of the female adapter (FEMALE THREAD). The second segment, away from the female adapter is formed to capture the hexagon body of the male adapter and leave enough space for the DELAY barrel 50, including the associated center conductor pin to be inserted. The hexagon is stopped from moving backwards when the thread extender is screwed on the female adapter using the at least two screws 52, 53. The screws are inserted perpendicularly into the mantle of the thread extender in such a way that their conical head catches the back edge of the hexagon 54. The tip of the screws shall not attach to the flat surface of the hexagon, since this does not secure a non-sliding contact. Two screws placed at 180 degrees are enough. If three screws are used that should be placed at 120 degrees of each other equidistantly distributed. A min8imum number of screws is recommended, since their grip on the hexagon also determines the angle if the contact of the RIM (FIGS. 2A and 2B) on the lip of the DELAY barrel. Two screws at least allow for some self-alignment under pressure, whereas three or more screws will determine a fixed surface with the risk of some residual misalignment. It is obvious that assembly of the DELAY standard requires some skill. In case of misalignment adjusting the mutual insertion depth of the screws will change slightly the angle of the RIM and compensate for it, within certain limits.

Figure 9A:
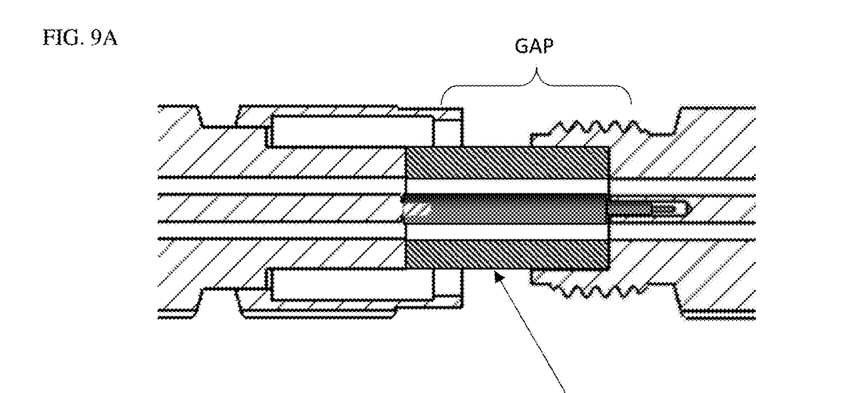
FIG. 9A depicts the creation of the gap caused by the DELAY line.
Figure 9B:
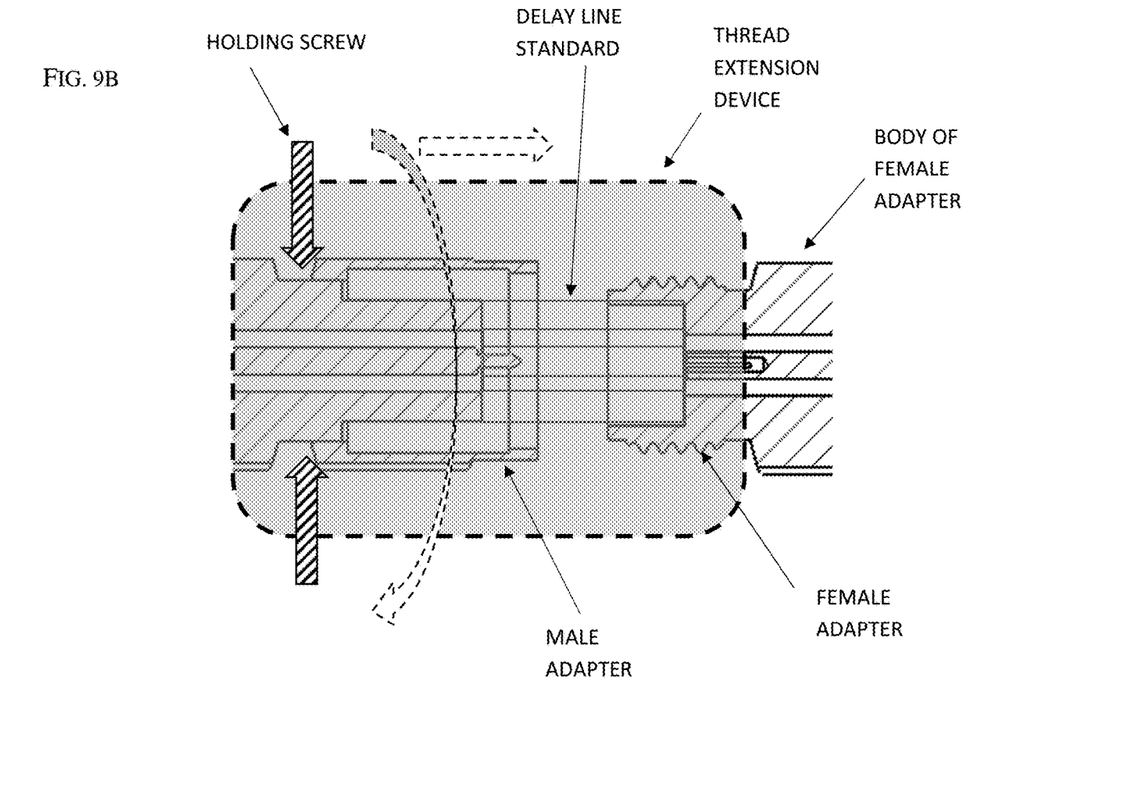
FIG. 9B depicts the mechanism for assembling and securing the DELAY standard using the Thread Extension device (TED).

As can be seen from FIG. 9B the thread extension device (TED) cannot be too long and reach beyond the end of the female thread, because it will conflict with the body of the female adapter. The thread extension device can be longer only towards the male adapter since there the hexagon body is normally larger than the body of the male adapter.

Figure 6A:
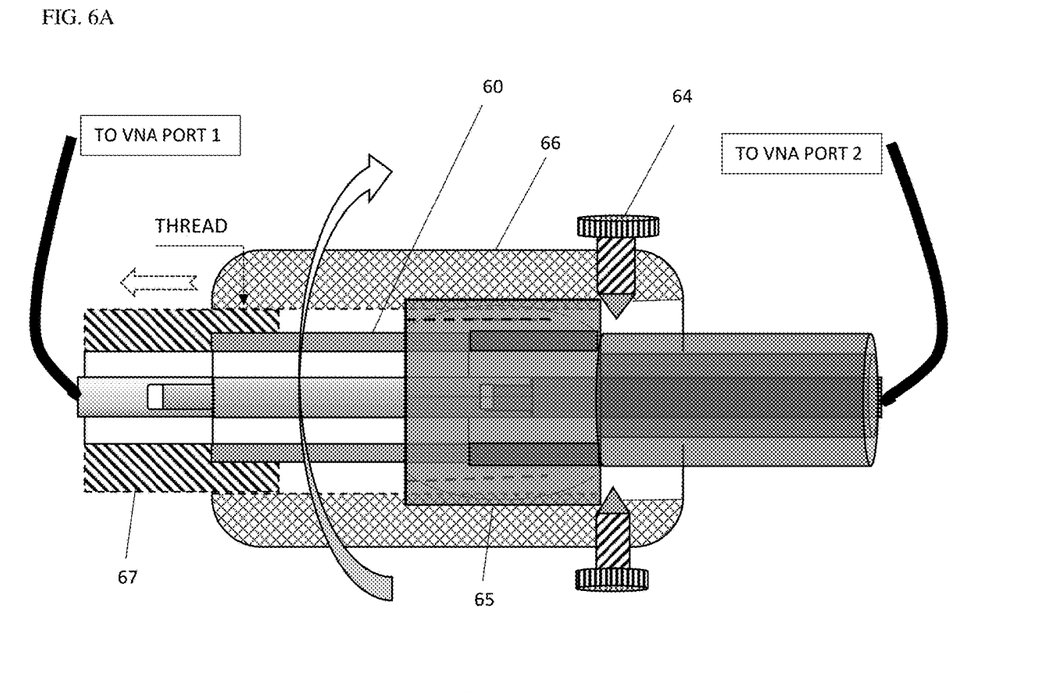
FIG. 6A depicts the holder with inserted DELAY line standard.
Figure 6B:
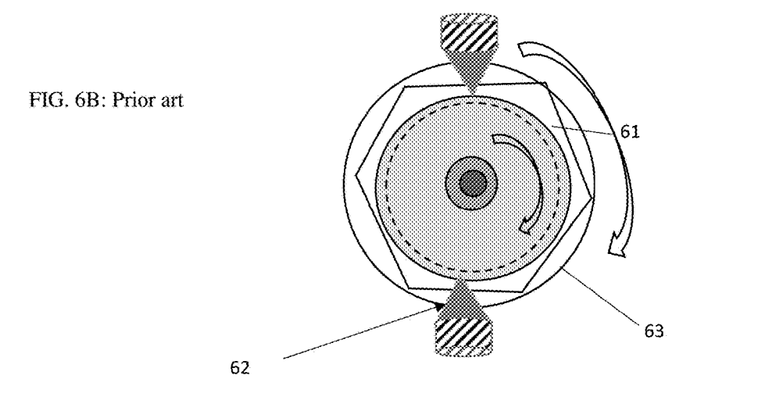
FIG. 6B depicts front view of connector hexagon with engaging holding screws.

FIG. 6A depicts a DELAY line holder with a single DELAY line 60 inserted. Holding screw 64 and its opposite catch with their conical tips 62 behind the hexagon 65 and, as the Thread extension device (TED) 66 rotates the hexagon 61 in the male adapter body 63 and screws on the female thread and pushes the barrel 60 against the RIM of the female adapter 67, creating an extended transmission line, or a DELAY Line.

Figure 7:
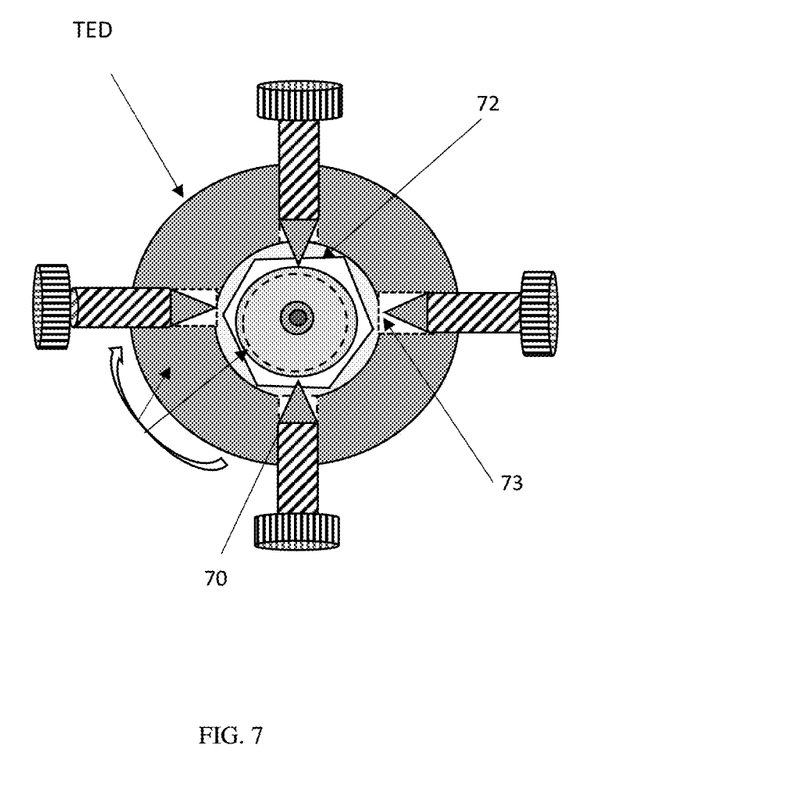
FIG. 7 depicts cross section and front view of thread extender for two DELAY line standards with one set screws engaged and one withdrawn.

A thread extension device (TED) for two DELAY line standards is shown, in cross section in FIG. 7. The cross section of FIG. 7 also demonstrates the basic idea of the device. It allows the hexagon body 72 of the male adapter to pass through. The engaged screws are 70 and its opposite, while screws 73 and its opposite are not engaged. The screws 70 reach over the edge and only prevent the hexagon from slipping back.

Figures 3A, 3B:
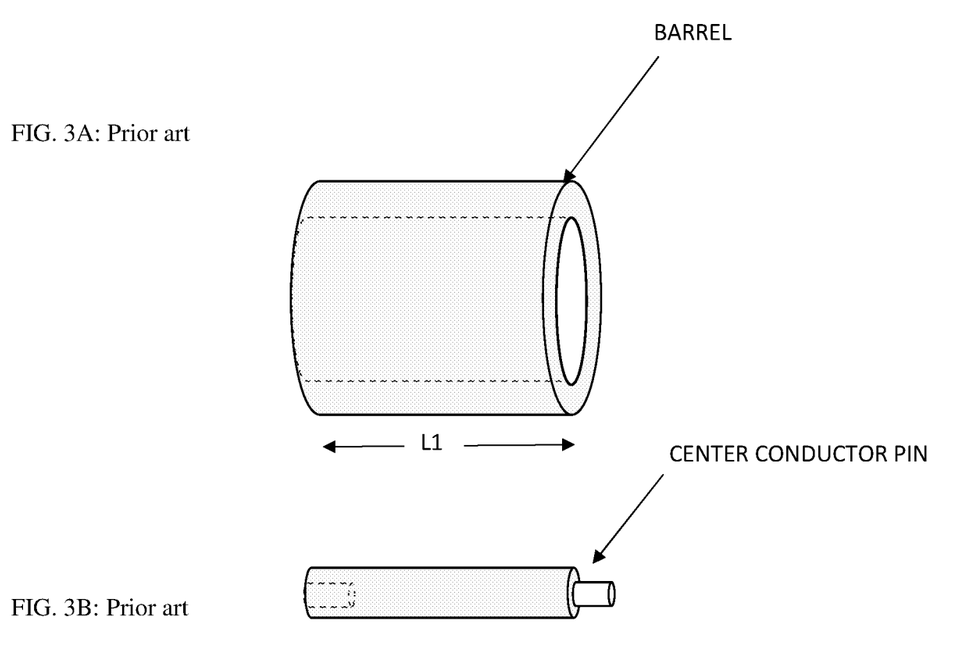
FIG. 3A depicts the DELAY barrel.
FIG. 3B depicts the DELAY center conductor pin.
Figure 4A:
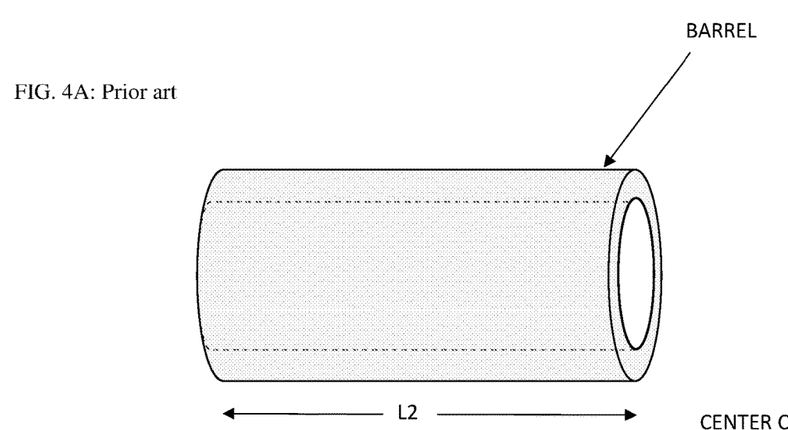
FIG. 4A depicts the barrel of the DELAY line.
Figure 4B:
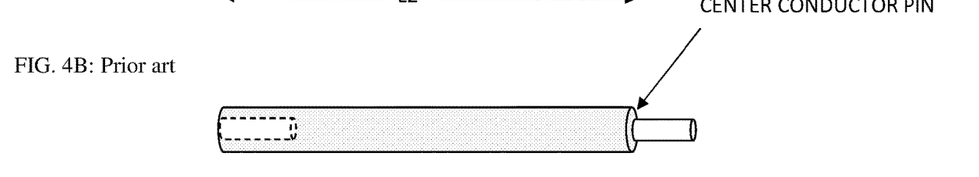
FIG. 4B depicts the center conductor pin of the DELAY line.
Figures 8A, 8B:
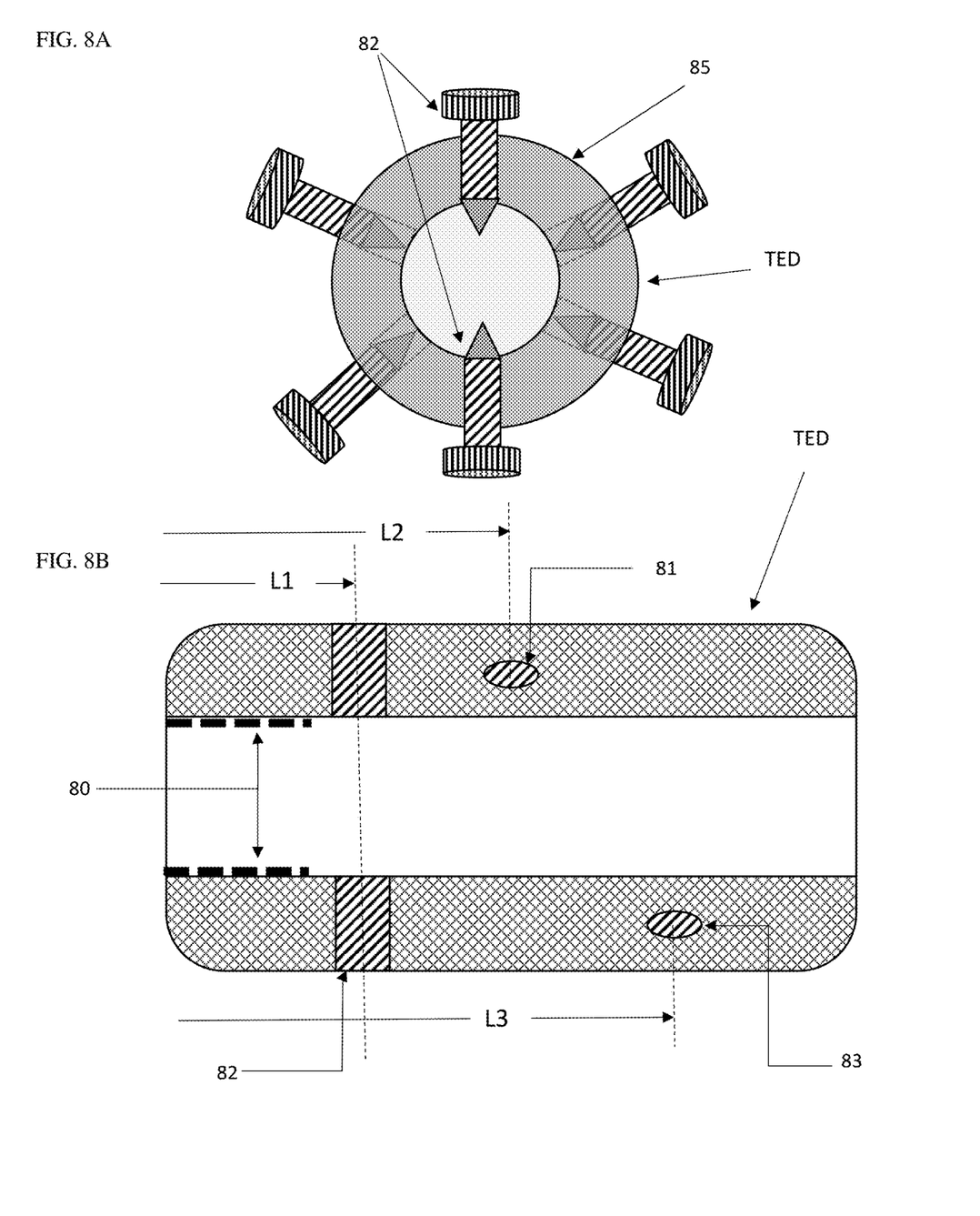
FIG. 8A depicts front view.
FIG. 8B depicts side cross section.

FIGS. 8A and 8B illustrate the embodiment of the thread extension device (TED) 85, for up to three DELAY standards. In the case of each standard, one set of screws at a time are engaged through the thread 80, leading to DELAY standard lengths L1, L2 or L3, whereas the two other sets of screws are not. As can be seen from FIG. 8B if screws 82 are engaged then this means the shortest DELAY line (L1) is used, when screws 81 are engaged then the medium length (L2) DELAY is used and when screws 83 are engaged then this means the longest (L3) DELAY is used. The associated lengths L1 and L2 are also shown in FIGS. 3A and 4A.

What is claimed is:

1. A thread extension device of Through-Reflect-Line (TRL) coaxial calibration kit for vector network analyzer (VNA), comprising:
  a metallic cylinder having a front end and a rear end, and sets of holding screws,
wherein
  the coaxial calibration kit includes:
    a THRU standard,
    a REFLECT standard, and
    at least one DELAY LINE standard,
and wherein
  the metallic cylinder is divided into two sections,
  a first section towards the front end is threaded inside to match a thread of a female adapter,
  and a second section towards the rear end is formed to capture a hexagon body of a male adapter,
wherein
  the hexagon body of the male adapter has a front edge towards the at least one DELAY LINE standard and a rear edge away from it, and wherein
- each set of holding screws for the DELAY LINE standards
- includes two screws with a conical tip, inserted radially diametrically on the perimeter of the second section at a distance from the front end of the metallic cylinder;

and wherein
- the distance of each set of holding screws from the front end of the metallic cylinder is chosen to allow a flank of the conical tip of each of the two holding screws to catch on the rear edge of the hexagon body after the at least one DELAY LINE standard has been inserted between the male and female adapters.

2. The DELAY line standard of claim 1,
a characteristic impedance.

3. The DELAY line standards of claim 1,
wherein
a characteristic impedance $Zd=Zo=50$ Ohm.

4. The thread extension device of TRL coaxial calibration kit as in claim 1,
wherein,
- each set of holding screws for the DELAY LINE standards
- includes at least three screws with a conical tip, which are inserted radially at equal angles on the perimeter of the second section of the metallic cylinder at a distance from the front end of the metallic cylinder;

and wherein
- the distance of each set of holding screws from the front end of the metallic cylinder is chosen to allow a flank of the conical tip of each of the at least three holding screws to catch on the rear edge of the hexagon body after the at least one DELAY LINE standard has been inserted between the male and female adapters.

* * * * *